United States Patent
Cooklev et al.

(10) Patent No.: US 6,486,810 B1
(45) Date of Patent: Nov. 26, 2002

(54) METHOD AND APPARATUS FOR CONTINUOUSLY VARIABLE SLOPE DELTA MODULATION CODING OF SIGNALS

(75) Inventors: Todor Cooklev, Moraga, CA (US); Darrin J. Gibbs, South Jordan, UT (US); Kenneth S. Morley, Draper, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/764,906

(22) Filed: Jan. 16, 2001

(51) Int. Cl.⁷ .................................................. H03M 3/00
(52) U.S. Cl. ........................ 341/143; 375/252; 341/50
(58) Field of Search .................................. 375/252, 251, 375/249, 216; 341/143, 144, 77, 114, 121, 139, 50

(56) References Cited

U.S. PATENT DOCUMENTS 3,500,441 A * 3/1970 Brolin ......................... 341/143
3,652,957 A * 3/1972 Goodman .................... 341/143
4,215,311 A * 7/1980 Kittel et al. ................. 341/143

OTHER PUBLICATIONS

J. Haartsen, "Bluetooth—The Universal Radio Interface for ad hoc, Wireless Connectivity", Ericsson Review, No. 3, 1998, pp. 2–9, no month.

J. Haartsen et al, "Bluetooth: Vision, Goals and Architecture", Mobile Computing and Communications Review, vol. 1, No. 2, pp. 1–8, no date.

"Bluetooth Specification Version 1.0A", Bluetooth Audio, Jul. 24, 1999, pp. 139–141.

* cited by examiner

Primary Examiner—Peguy JeanPierre
Assistant Examiner—Jean Bruner Jeanglaude
(74) Attorney, Agent, or Firm—Michaelson & Wallace; Peter L. Michaelson; Janet M. Skafar

(57) ABSTRACT

Continuously variable slope delta modulation coding uses a thresholder having an analog input and a digital output representing the relationship between a signal amplitude at the analog input and a predetermined threshold. An integrator has an output and one input connected to the output of the thresholder and a second input that receives a step size value, the output of the integrator corresponding to a product of the thresholder output and the step size value. An adder has one input that receives an analog input signal that is to be encoded and a second input connected to the output of the integrator. The output of the adder is coupled to the analog input of the thresholder. A step size controller is responsive to an analog signal level related to the analog input signal for varying the step size value in response to variations in the analog signal level.

37 Claims, 9 Drawing Sheets

METHOD AND APPARATUS FOR CONTINUOUSLY VARIABLE SLOPE DELTA MODULATION CODING OF SIGNALS

BACKGROUND OF THE INVENTION

1. Technical Field

The invention is related to devices for digitally encoding analog signals for transmission in a digital communication channel. In particular, the invention is an improvement in variable slope delta modulation coding.

2. Background Art

Continuously variable slope delta modulation (CVSD) coding of signals provides relatively low compression ratios but has the advantage of being very robust to errors in transmission. For this reason, it is an ideal way for coding signals in low power radio-based networks of portable electronic devices. Such networks are sometimes referred to as piconets. In fact, a recently proposed industry standard for such piconets relies upon CVSD coding. Piconets are but one example of the application of CVSD coding. In a piconet according to the proposed industry standard, as many as seven electronic devices may be networked together via radio, specifically using transceivers operating in the license-free 2.45 GHz band. Such portable electronic devices may include a portable (notebook) computer, a cellular telephone, an access port to a local area network, a head set, computer peripherals, (printers, etc.). Of course, the cell phone can provide the piconet access to the internet.

CVSD coding is described, for example, in U.S. Pat. No. 4,783,644 and in U.S. Pat. No. 4,446,565, both of which are incorporated herein by reference. The first aforementioned patent describes CVSD coding of speech signals. A CVSD encoder operates by comparing the input analog signal with a signal reconstructed from the digital output of the encoder. When the input analog signal amplitude is less or greater than the reconstructed signal, the digital output of the encoder for the next clock period is set to one or the other binary value, respectively. The reconstructed signal is produced by supplying the encoded digital signal to an integrator with a continuously variable slope. The continuously variable slope is adjusted to track more closely the input analog signal. Conventionally, the step size of the integrator is fixed. In the proposed industry standard for piconets, the CVSD encoder has been improved somewhat by adjusting the step size depending upon whether the digital output signal binary value changes over a certain number of samples.

Despite the improvement of the step size adjustment in the proposed industry standard version of CVSD coding, it is recognized by the present inventors that the step size does not change sufficiently fast. As a result, in regions where the input signal is of low dynamic range, the encoded digital output represents a poor approximation of the input analog signal. This is because the step size exceeds the input analog signal amplitude, and the digital output signal cannot decrease sufficiently fast to track the analog input signal. The resulting oscillations in the digital output signal can be reduced only by low pass filtering.

Another problem in CVSD signal coding is that the error between the analog input signal and the encoded digital output signal is signal-dependent. The mean and variance of the error are signal-dependent. This effect is referred to as noise modulation which, at lower bit rates, becomes audible and in any case presents a source of signal distortion that reduces system performance. Thus, CVSD signal coding appears to be hampered by inherent limitations on performance that distort the encoded digital output signal. Such distortion manifests itself as higher error rates in the communication channel. Such errors either overwhelm the error correction capability of the communication system, leading to failure, or require more data overhead for error correction which reduces the maximum data rate of the system. However, it has not seemed possible to overcome such problems in CVSD signal coding.

SUMMARY OF THE INVENTION

The invention is embodied in a method and apparatus for continuously variable slope delta modulation coding of signals, the apparatus including a thresholder having an analog input and a digital output representing the relationship between a signal amplitude at the analog input and a predetermined threshold. An integrator has an output and one input connected to the output of the thresholder and a second input that receives a step size value, the output of the integrator corresponding to a product of the thresholder output and the step size value. The apparatus further includes an adder having one input that receives an analog input signal that is to be encoded and a second input connected to the output of the integrator, the output of the adder being coupled to the analog input of the thresholder. A step size controller is responsive to an analog signal level related to the analog input signal for varying the step size value in response to variations in the analog signal level. In addition, the apparatus may further include a source producing noise. A noise amplitude controller is responsive to an analog signal level related to the analog input signal for varying the amplitude of the noise in response to variations in the analog signal level to produce noise having a controlled amplitude sufficient to reduce the correlation with the analog input signal of an error between the output of the integrator and the analog input signal. An adder adds the noise having a controlled amplitude to the analog input signal.

With the step size control being responsive to changes in the input signal dynamic range as described above, the problem of distortion at low dynamic range is solved. In addition, however, the present invention also solves the problem of noise modulation or the dependence of the noise or error on the input signal. This latter problem is solved by adding pseudo-random noise to the analog input signal. The amplitude of the pseudo-random noise is controlled relative to the amplitude of the input signal so that it is relatively small. Specifically, in one implementation it is equal to the least-significant bit of the desired audio resolution. This level of noise is sufficient to transform the signal-dependent error into signal independent error. The effects of signal-independent error are much more benign to the ear (than signal-dependent noise) because it is random noise. At high bit rates, this noise may be below the audible threshold. It is a discovery of the invention that it is advantageous in CVSD coders to reduce (or eliminate) the correlation of the error with the input analog signal at the expense of increasing uncorrelated (random) error.

DETAILED DESCRIPTION OF THE PREFERRED EMBODIMENTS

Figure 1:
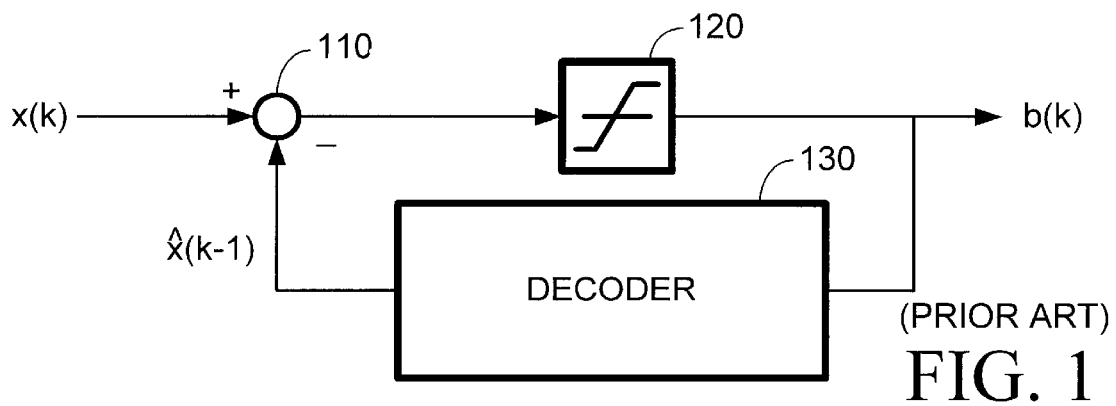
FIG. 1 is a block diagram of a CVSD encoder of the prior art.

Conventional CVSD encoding is illustrated in FIG. 1. An analog signal to be encoded is sampled at successive intervals, producing a succession of analog signal samples x(k). A subtractor 110 outputs the difference between the current analog signal sample x(k) and a reconstructed version X(k−1) of the previous analog signal sample x(k−1). The reconstructed sample X(k−1) is the result of CVSD encoding of the previous signal sample x(k−1) to produce an encoded sample b(k−1), and then decoding b(k−1). The difference produced by the subtractor 110 is applied to the input of a thresholder 120. The thresholder 120 produces either a binary zero or a binary one, depending upon whether the difference at its input is above or below a predetermined threshold. The output of the thresholder 120 is the current digital encoded output signal b(k). The reconstructed signal is produced by applying the encoded output signal b(k) from the encoder output to the input of a CVSD decoder 130 that forms a part of the encoder of FIG. 1.

Figure 2:
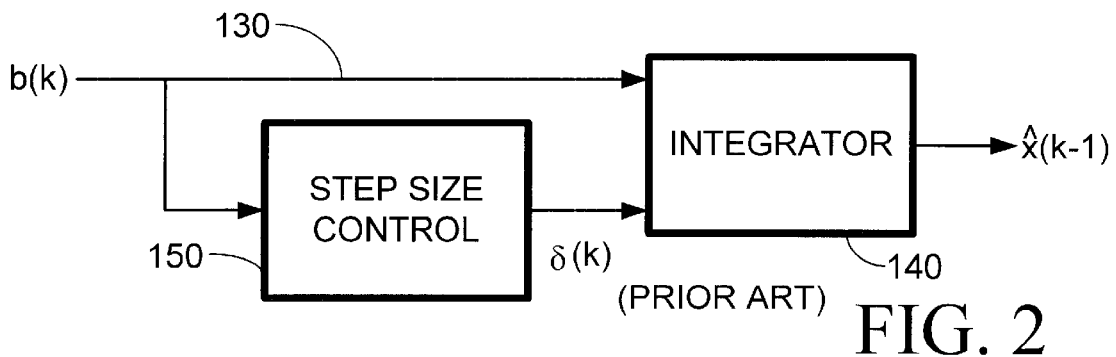
FIG. 2 is a block diagram of a CVSD decoder of the prior art.

The structure of the CVSD decoder 130 is illustrated in FIG. 2 and includes an integrator 140 and a step size controller 150. The output signal b(k) is applied to the input of the integrator 140 and to the input of the step size controller 150. The integrator 140 integrates the output signal sample b(k) using a step size δ(k) determined by the step size controller 150.

The step size controller 150 defines the current step size δ(k) as a minimum step size if J bits in the last K samples of the output signal b(k) are unchanged and as a maximum step size otherwise. This procedure is referred to as syllabic companding. The minimum step size is the lesser of: (1) the sum of the most recent step size δ(k−1) and a predetermined minimum δ(min) or (2) a maximum step size δ(max). The maximum step size is the greater of: (1) the product of the most recent step size δ(k−1) and a decay factor β or (2) the minimum step size δ(min).

Figure 3:
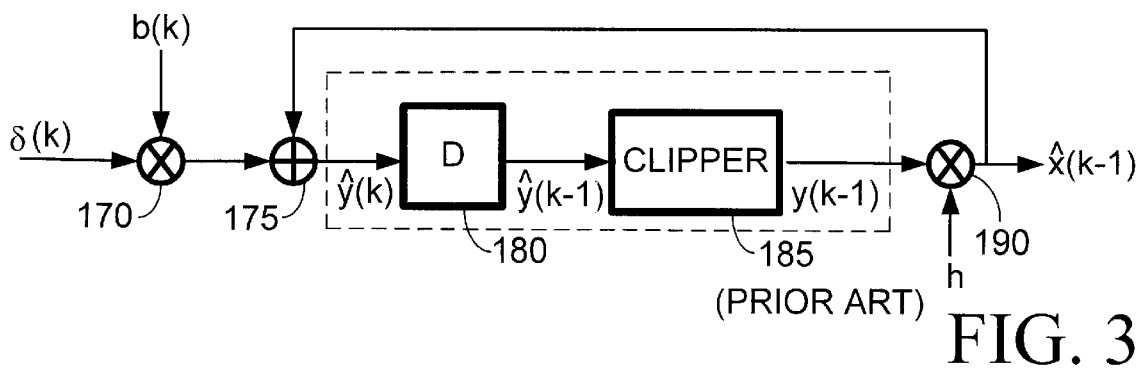
FIG. 3 is a block diagram illustrating the accumulator employed in the encoder and decoder of FIGS. 1 and 2.

The structure of the integrator 140 is illustrated in FIG. 3 and includes a multiplier 170 that receives the encoder output b(k) and the step size controller output δ(k). An adder 175 computes the sum Y(k) of (1) the output b(k)δ(k) of the multiplier 170 with the most recent output sample X(k−1) of the integrator 140 and the result is stored in a delay buffer 180. The output of the delay buffer Y(k−1) is processed by a clipper 185 that provides an output y(k−1). The clipper output y(k−1) is determined by the clipper 185 as follows: if Y(k−1) is non-negative, then y(k−1) is the lesser of Y(k−1) and a positive saturation value y(max); otherwise, y(k−1) is the greater of Y(k−1) and a negative saturation value y(min). The clipper output y(k−1) is multiplied by a multiplier 190 with an integration decay factor h, and the result is the integrator output X(k−1).

In the industry standard version of CVSD coding, the decay factors h and δ are less than unity, typically 1−1/32 and 1−1/1024 respectively. The syllabic commanding parameters J and K are typically both 4. The minimum and maximum step sizes δ(min) and δ(max) are typically 10 and 1280. The positive and negative saturation values y(max) and y(min) are typically $2^{15}-1$ and $-2^{15}+1$, respectively.

Significantly, the step size as determined by the step size controller 150 depends only upon the variation among bits within a certain interval, as described above, and therefore is not directly responsive to variations in dynamic range of the analog input signal. This aspect prevents the step size from changing sufficiently fast to avoid distortions when the analog input signal is of low dynamic range. In such a case, when the step size exceeds the analog input signal amplitude, the output signal cannot decrease sufficiently fast to follow the input analog signal. Another problem is that the error between the analog input signal and the encoded output signal is signal-dependent, which leads to audible distortion.

Figure 4:
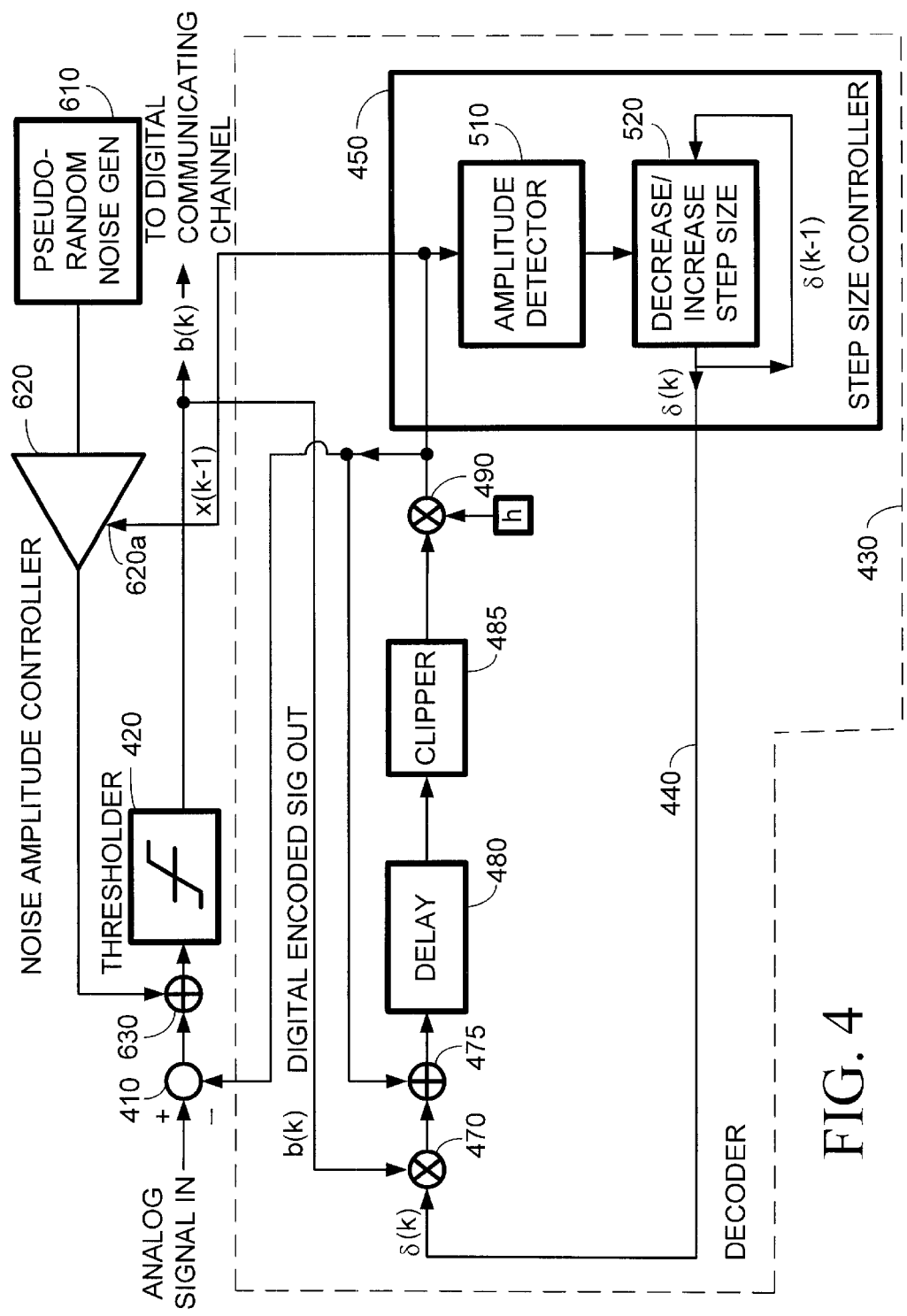
FIG. 4 is a block diagram of a CVSD encoder in accordance with a preferred embodiment of the present invention.

These problems are solved in the preferred embodiment of the invention illustrated in FIG. 4. In the CVSD encoder of FIG. 4 includes an adder 410 corresponding to the adder 110 of FIG. 1, a thresholder 420 corresponding to the thresholder 120 of FIG. 1 and a decoder 430. The decoder 430 includes an integrator 440 corresponding to the integrator 140 of FIG. 1. Specifically, the integrator 440 includes a multiplier 470 corresponding to the multiplier 170 of FIG. 1, an adder 475 corresponding to the adder 175 of FIG. 1, a delay 480 corresponding to the delay 180 of FIG. 1, a clipper 485 corresponding to the clipper 185 of FIG. 1, and a multiplier 490 corresponding to the multiplier 190 of FIG. 1.

The decoder 430 further includes a step size controller 450 that functions in a manner completely differently from that of the step size controller 150 of FIG. 1. Specifically, the step size controller 450 of FIG. 4 controls the step size δ(k) based upon the dynamic range of the analog input signal x(k). This feature solves the problem of distortion that occurs when the analog input signal decreases to a low dynamic range. Thus, unlike the step size controller 150 of FIG. 1, the step size controller 450 of FIG. 4 receives as an input the analog signal, preferably the reconstructed analog signal produced by the decoder 440 of FIG. 4.

In the embodiment of FIG. 4, the step size controller 450 includes an amplitude detector 510 that monitors the amplitude of the encoded digital output signal b(k) from the encoder. Step size control logic 520 tracks the changes in the analog input signal amplitude detected by the detector and either increases or decreases the current step size δ(k) relative to the previous step size δ(k−1), depending upon whether the input signal amplitude increases or decreases. For this purpose, the step size controller 520 uses the current step size to compute the next step size. This feature is indicated as a feedback loop of the current step size output δ(k) back to an input of the step size control logic 520. The step size δ(k) is applied as an input to the multiplier 470.

Figure 5:
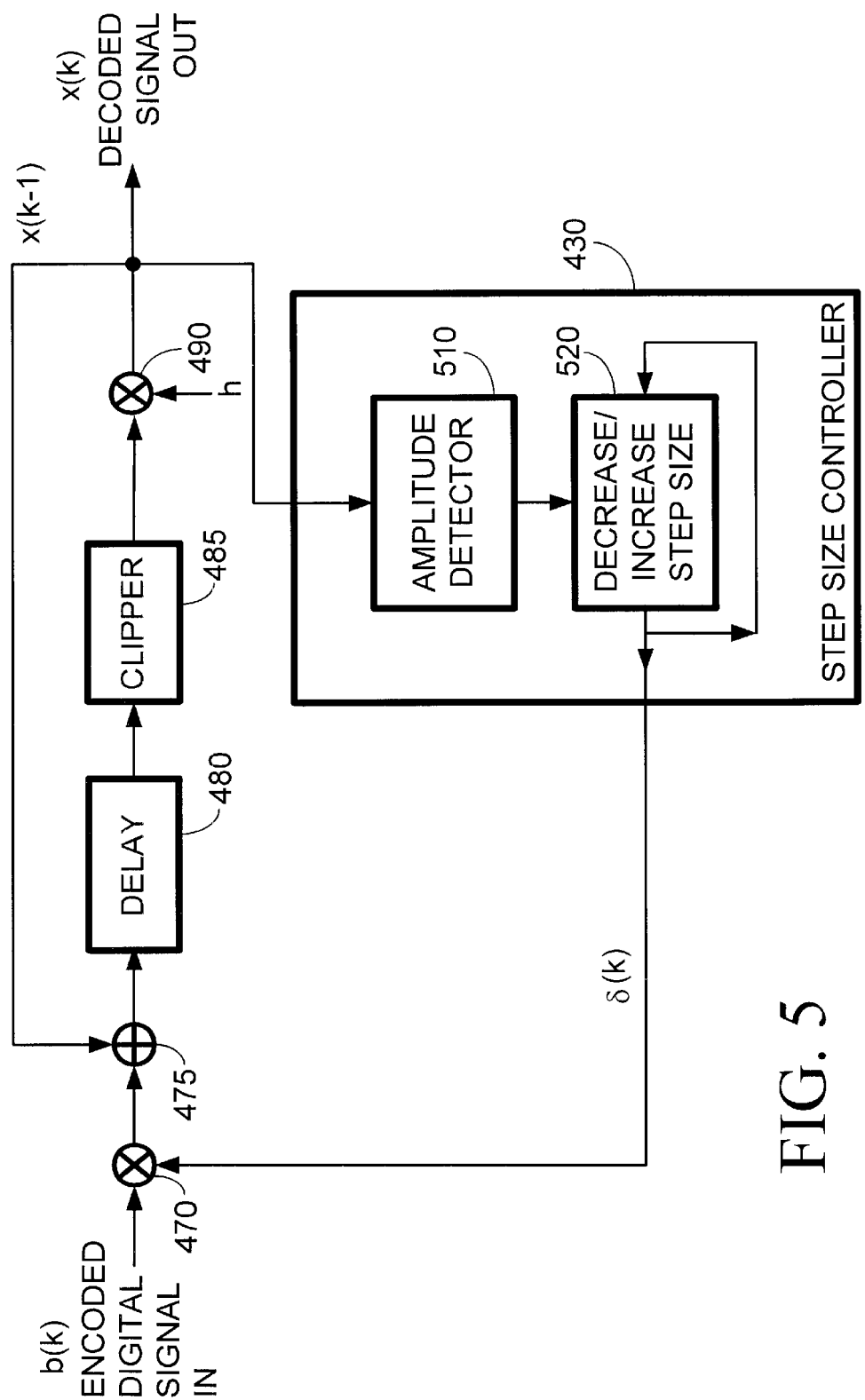
FIG. 5 is a block diagram of a CVSD decoder in accordance with another embodiment the invention.

FIG. 4 illustrates how a decoder 430 is included within the encoder for purposes of encoding an analog signal prior to transmission by a transmitter. However, a separate stand-alone decoder must be employed in any receiver that is to receive the transmitted signal. FIG. 5 therefore illustrates a decoder 430 as it would be employed in decoding the signal received from the transmitter at a receiver. The decoder of FIG. 5 is identical to the decoder 430 contained within the encoder of FIG. 4.

Figure 6:
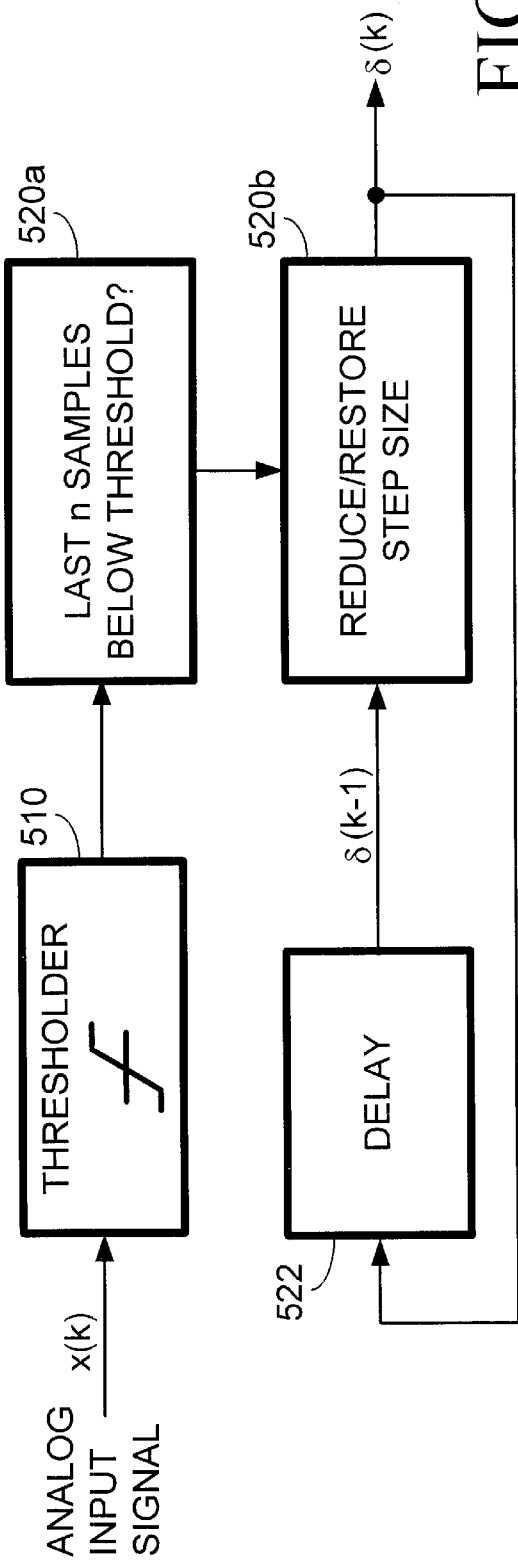
FIG. 6 is a block diagram of the step size controller of the CVSD encoder of FIG. 4.

In the decoder 430, the step size controller 520 may operate in various suitable ways in order to render the step size responsive to the analog input dynamic range in accordance with the invention, and FIG. 6 illustrates one example. In the example of FIG. 6, the amplitude detector 510 is a thresholder 510 whose output signals whether the analog signal amplitude (of the reconstructed analog signal X(k−1) is above or below a predetermined threshold. The step size control logic 520 is divided into two logic functions 520a and 520b. The first logic function 520a determines whether the last M samples of the analog signal were above or below a predetermined threshold. The second logic function 520b either reduces the step size or restores it to its original value depending upon the output of the first logic function 520a. The output of the second logic function 520b is fed back through a delay 522 to an input of the second logic function 520b so that the second logic function 520b has the value of the previous step size with which to compute the next step size. Furthermore, the second logic function 520 may have the capability of storing the largest computed step size so that it knows what to restore the current step size to whenever the analog level rises above the threshold of the detector 510.

In one example, the step size controller 520 functions by reducing the step size δ(k) from the size of the previous step size δ(k−1) by a factor of 5 whenever the reconstructed analog signal amplitude, X(k−1), falls below 0.1 for four consecutive sample periods, where the analog signal maximum and minimum values are 1 and −1. Furthermore, the step size is restored to its previous value whenever the reconstructed analog signal exceeds 0.1. More complex schemes can be designed to carry but the invention. For example, the step size range could be divided into multiple levels and each level associated with a different analog signal threshold. In such a scheme, the step size controller 450 places the step size to one of those levels whenever the reconstructed signal amplitude falls below the corresponding one of the thresholds for a minimum number of sample periods. Moreover, the required sample period may differ for different levels.

In one variation, since the analog input signal is available at the encoder, the step size controller 450 within the encoder of FIG. 4 could use the analog input signal x(k) as its input rather than the reconstructed analog signal X(k) from the decoder 430. Of course, at a receiver the analog input signal is not available and therefore the decoder of FIG. 5 could not employ this variation when installed in a receiver.

With the step size control being responsive to changes in the input signal dynamic range as described above, the problem of distortion at low dynamic range is solved. In addition, however, the present invention also solves the problem of noise modulation or the dependence of the noise or error on the input signal. This latter problem is solved by adding pseudo-random noise to the analog input signal. The amplitude of the pseudo-random noise is controlled relative to the amplitude of the input signal so that it is relatively small. Specifically, in one implementation it is equal to the least-significant bit of the desired audio resolution. This level of noise is sufficient to transform the signal-dependent error into signal independent error. The effects of signal-independent error are much more benign to the ear (than signal-dependent noise) because it is random noise. At high bit rates, this noise may be below the audible threshold. It is a discovery of the invention that it is advantageous in CVSD coders to reduce (or eliminate) the correlation of the error with the input analog signal at the expense of increasing uncorrelated (random) error. There are two fundamental reasons why this is advantageous. First, the CVSD coding technique is very robust to uncorrelated errors. Second and more importantly, the human perception is much more sensitive to correlated errors than to uncorrelated errors. In addition, uncorrelated errors may be reduced by conventional noise filtering techniques.

Any one of various types of pseudo-noise sources may be used. In a simulation of the present invention, the inventors herein employed a random variable that is uniformly distributed between +A and −A, where A is the noise amplitude. The noise amplitude A should be chosen so that the noise does not dominate the input signal in the encoded signal. On the other hand, the noise amplitude A must be sufficient to render the error in the encoded signal independent of the input analog signal. In order to fulfill these requirements, the noise amplitude A is varied as a function of the reconstructed analog signal amplitude. In the simulation, the noise amplitude was varied in such a manner that it was reduced by a factor of 10 whenever the reconstructed signal amplitude fell below 0.1 for four consecutive sampling periods. While various choices of the manner in which the noise amplitude may be varied may be made in accordance with the invention, the choice must be such as to avoid adding too much pseudo-noise when the analog input signal is of smaller dynamic range and to avoid adding too little pseudo-noise when the analog input signal is of a higher dynamic range.

Referring now to FIG. 4, the foregoing is carried out in the encoder by a pseudo-random noise generator 610 and a noise amplitude controller 620 connected to the output of the noise generator 610. The amplitude controller 620 has a gain/attenuation control input 620a connected to receive the reconstructed analog signal X(k−1) from the output of the decoder 430. In this way, the amplitude controller adjusts the amplitude of the noise signal from the noise generator 610 in response to changes in the dynamic range of the analog signal. Preferably, the controller 620 senses the number of samples over which the analog signal has decreased below a certain threshold (e.g., 0.1), and enables a reduction in the noise amplitude only after the analog signal level remains below the threshold for a predetermined number of sample periods. The output of the amplitude controller (the noise signal with the desired amplitude) is added by an adder 630 to the input analog signal prior to thresholding by the thresholder 420.

Figure 7:
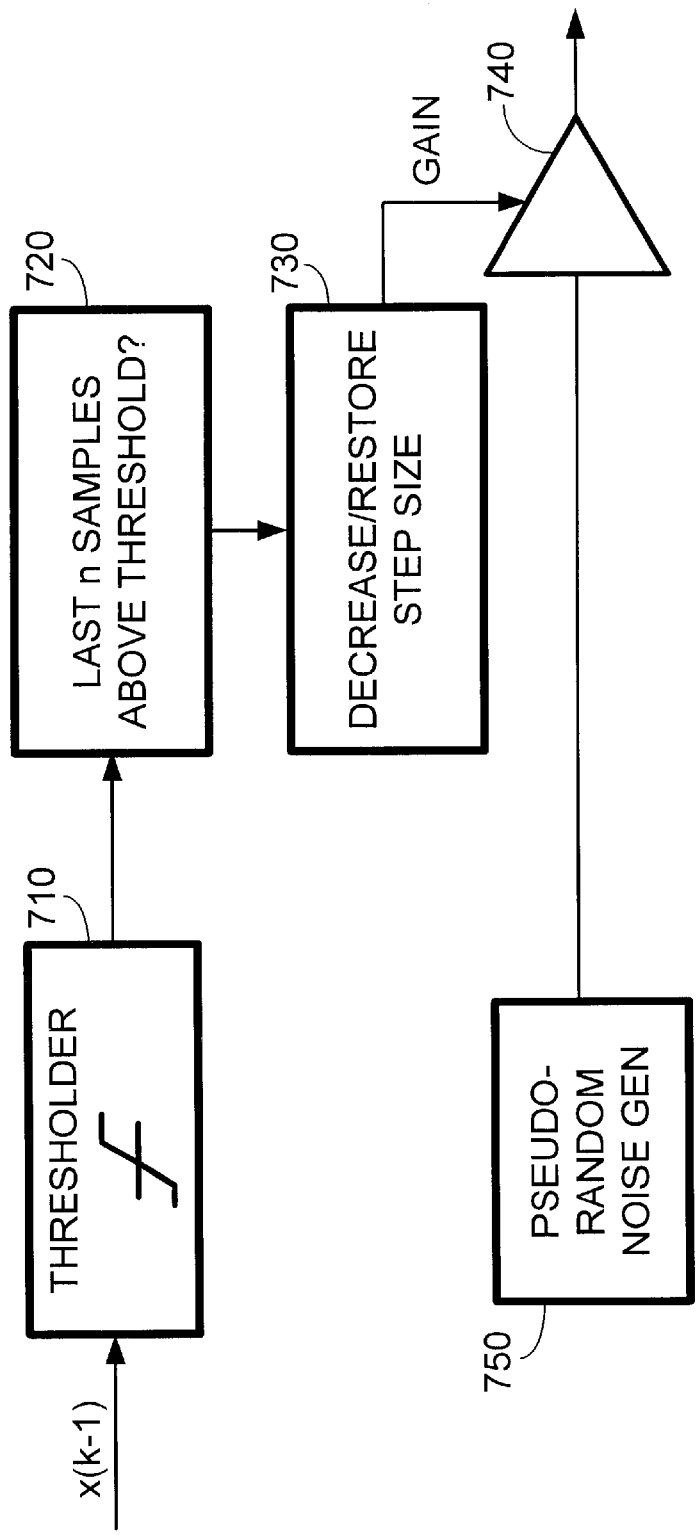
FIG. 7 is a block diagram of the noise amplitude controller of the CVSD controller of FIG. 4.

One embodiment of the combination of the random noise generator and noise amplitude controller 610, 620 is shown in FIG. 7. In FIG. 7, a thresholder 710 monitors the reconstructed analog signal amplitude and produces a signal indicating whether the amplitude is above or below a predetermined threshold. A logic circuit 720 responsive to the thresholder 710 outputs a signal if the thresholder output remains low for more than a predetermined number (e.g., 4) sample periods. Another logic circuit 730 interprets the output of the logic circuit 720 to produce a signal that increases or decreases the random noise amplitude. This signal is applied to the control input of a gain/attenuation circuit 740 that controls the amplitude of a noise signal produced by a pseudo-random noise generator 750. More complex schemes can be designed to carry out the invention. For example, the noise amplitude range could be divided into multiple levels and each level associated with a different analog signal threshold. In such a scheme, the control logic 730 places the step size to one of those levels whenever the reconstructed signal amplitude falls below the corresponding one of the thresholds for a minimum number of sample periods. Moreover, the required sample period may differ for different levels.

Since both the analog input signal x(k) and the reconstructed analog signal X(k−1) are available in the encoder of FIG. 4, the pseudo-random noise amplitude may be controlled either by the amplitude of the reconstructed analog signal X(k−1) as described above in detail, or, instead, by the analog input signal amplitude.

Other variations may be made in carrying out the invention, such as minor circuit modifications. For example, the positions of the adders 410 and 630 may be exchanged.

Figure 8:
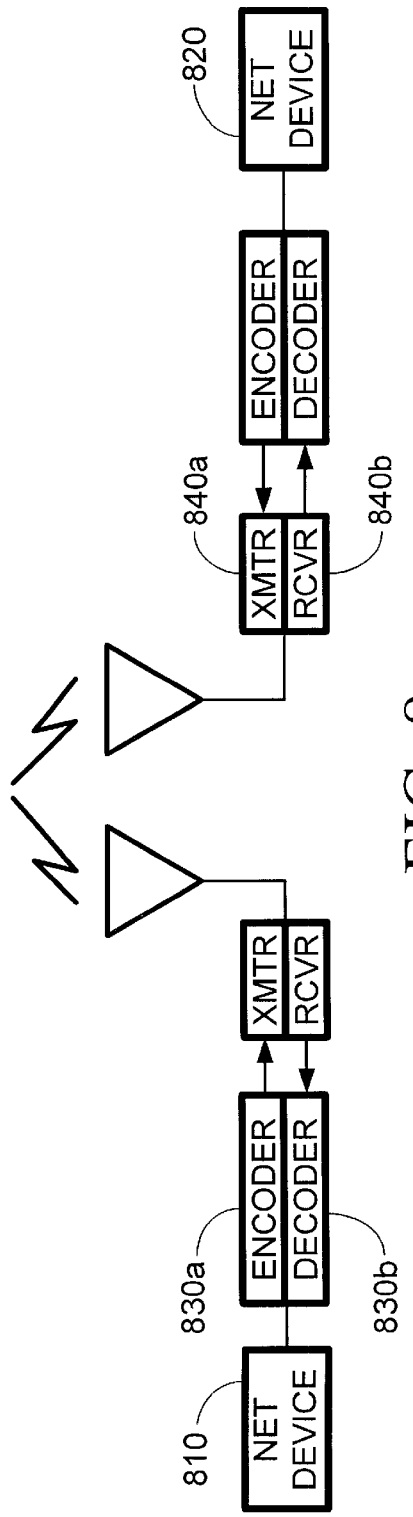
FIG. 8 is a block diagram of a communication link employing the CVSD encoder of FIG. 4.
Figure 9:
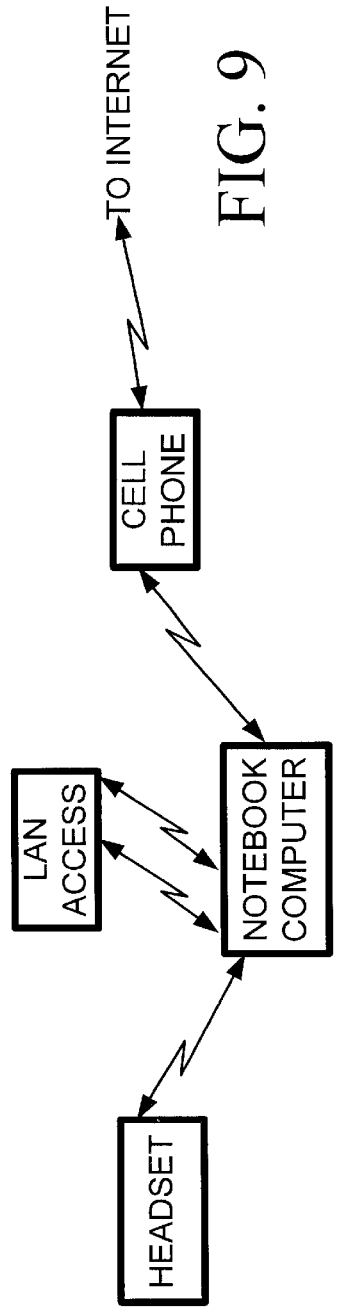
FIG. 9 is a block diagram of a piconet employing plural communication links of the type illustrated in FIG. 7.

FIG. 8 illustrates a communication link that connects a pair of electronic devices 810, 820. The link consists of an encoder of the type illustrated in FIG. 4 and a decoder of the type illustrated in FIG. 5 connected between each electronic device 810, 820 and a respective transmitter and receiver pair 830a, 830b, 840a, 840b. FIG. 9 illustrates a network of several electronic devices linked together in the manner of FIG. 8. Such devices may include one or more portable computers, head sets, cellular telephones, cordless telephones, local area network access ports, and so forth.

Figure 10:
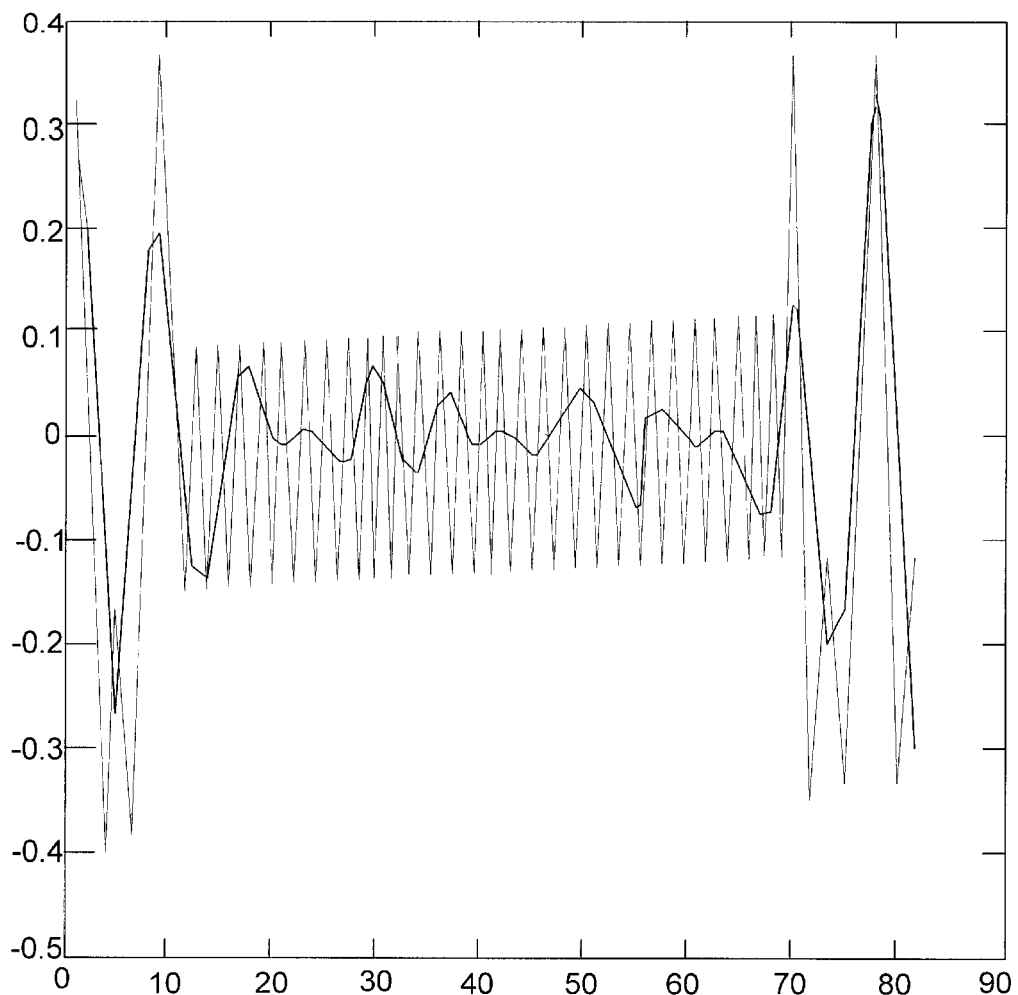
FIG. 10 is a graph of time domain waveforms of the original and reconstructed analog input signal obtained with conventional CVSD coding techniques.
Figure 11:
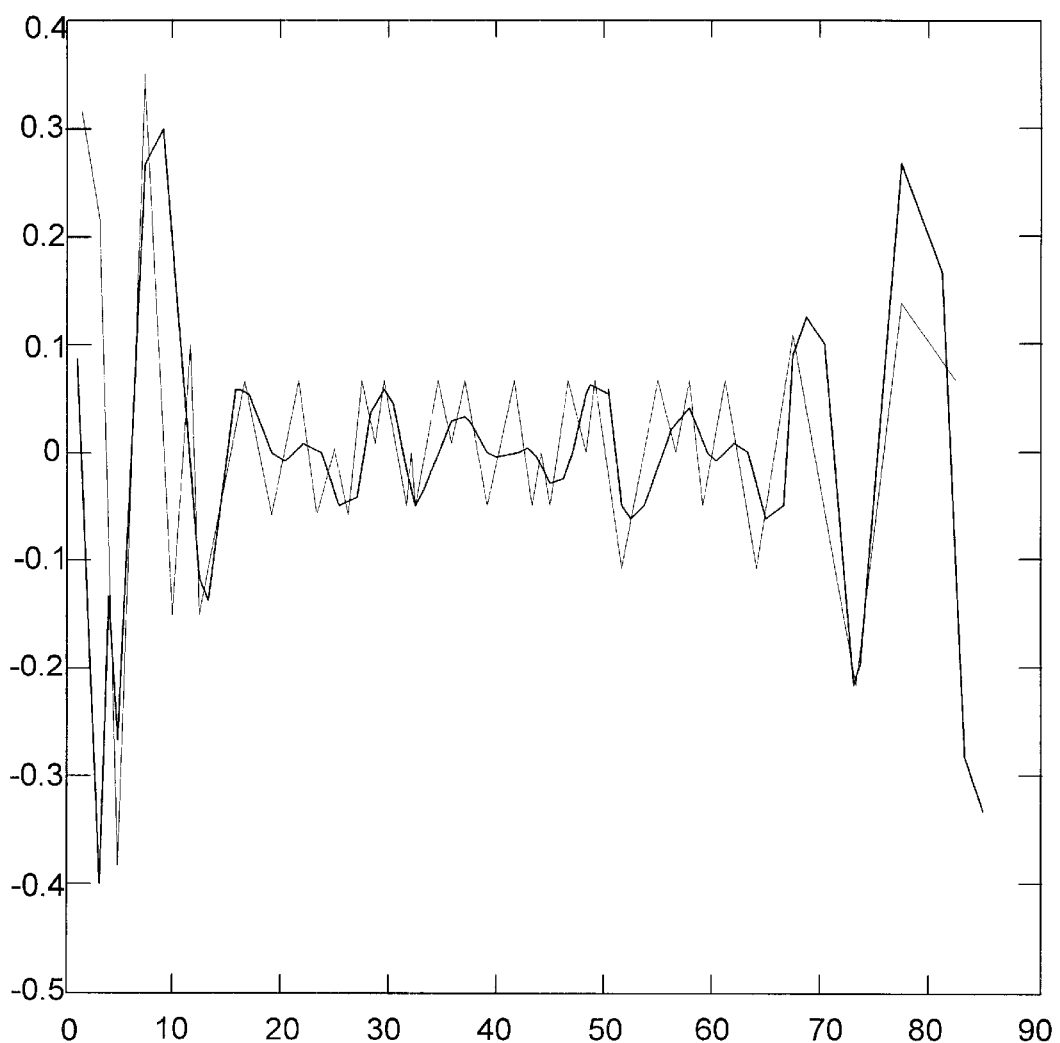
FIG. 11 is a graph of time domain waveforms of the original and reconstructed analog input signal obtained with the CVSD encoder and decoder of FIGS. 4 and 5 without the pseudo-random noise generator.
Figure 12:
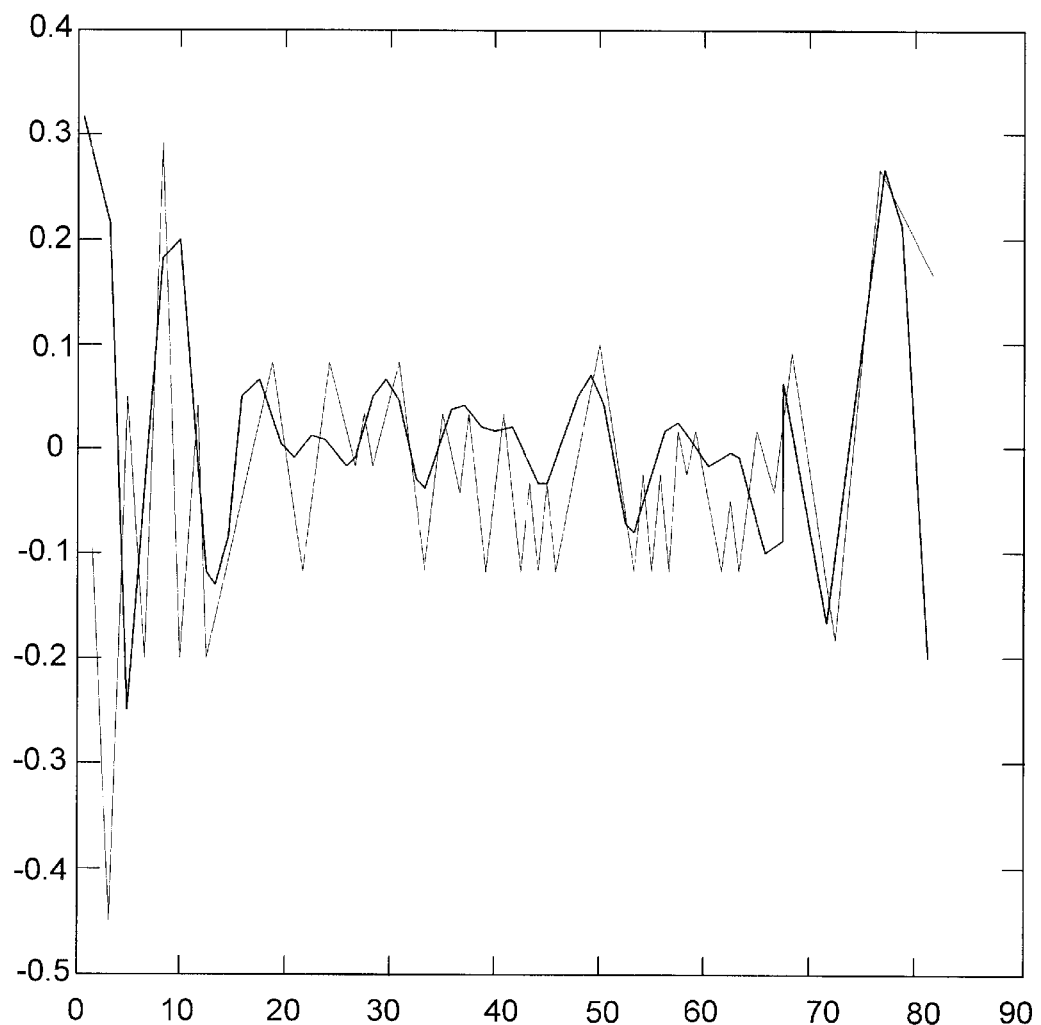
FIG. 12 is a graph of time domain waveforms of the original and reconstructed analog input signal obtained with the CVSD encoder and decoder of FIGS. 4 and 5 with the pseudo-random noise generator.

FIGS. 10–12 provide a comparison between the performance of a conventional CVSD coder of FIGS. 1–3 and the performance of the present invention. The performance data illustrated in FIGS. 10–12 were obtained in computer simulations. FIG. 10 is a graph of an input analog signal and an analog signal produced by CVSD encoding and then CVSD decoding using the conventional CVSD encoder of FIG. 1 and decoder of FIG. 2. FIG. 11 is a graph of an analog input signal and an analog signal produced by CVSD encoding and then decoding using the encoder of FIG. 4 without the pseudo-random noise generator 610 and the decoder of FIG. 5. FIG. 12 is a graph of an analog input signal and an analog signal produced by encoding the analog input signal with the encoder of FIG. 4 including the pseudo-random noise generator 610 and decoding with the decoder of FIG. 5. In FIG. 10, it can be seen that conventional CVSD coding provides poor fidelity in the region (between times 10 and 95) in which the input signal amplitude is low and the frequency high. There is a marked reduction in error in the low amplitude portion of the signal in FIG. 11 relative to FIG. 10 with the introduction of the feature of dynamic range-dependent integration step size. With the introduction of the pseudo-random noise generator represented by the results of FIG. 12, there is less correlation of the error to the input signal, as desired.

While the invention has been described in detail by specific reference to preferred embodiments, it is understood that variations and modifications thereof may be made without departing from the true spirit and scope of the invention.

What is claimed is:

1. An encoder comprising:
   a thresholder having an analog input and a digital output representing the relationship between a signal amplitude at said analog input and a predetermined threshold;
   an integrator having an output and one input connected to the output of the thresholder and a second input that receives a step size value, the output of the integrator corresponding to a product of said thresholder output and said step size value;
   an adder having one input that receives an analog input signal that is to be encoded and a second input connected to the output of said integrator, the output of said adder being coupled to said analog input of said thresholder; and
   a step size controller responsive to an analog signal level related to said analog input signal for determining and varying said step size value in response to variations in said analog signal level, said step size controller having an amplitude detector to determine and output whether an amplitude of the analog signal level is above a predetermined detector threshold, means for storing a previous step size value, means for restoring said step size value to said previous step size value based on the output of said amplitude detector, means for storing a largest value of said step size that was determined by said step size controller, and means for restoring the step size to the largest determined step size when the amplitude of the analog signal level exceeds the detector threshold of the amplitude detector.

2. The encoder of claim 1 wherein said step size controller comprises means for reducing said step size by a predetermined amount whenever said analog signal level is reduced by a threshold amount for a prescribed number of sample periods.

3. The encoder of claim 1 wherein said step size controller comprises means for regulating said step size so as to prevent said step size from exceeding the amplitude of said analog input signal.

4. The encoder of claim 3 wherein said step size controller comprises means for regulating said step size so as to maintain said step size less than the amplitude of said analog input signal by a desired amount.

5. The encoder of claim 1 wherein the output of said integrator corresponds to a reconstructed version of said analog input signal, and wherein said analog signal level related to said analog input signal is the amplitude of the output of said integrator.

6. The encoder of claim 1 wherein said analog signal level is the amplitude of said analog input signal.

7. The encoder of claim 1 wherein said integrator comprises:
   an integration multiplier that produces a product of said thresholder output and said step size value;
   an integration adder having an output and a pair of inputs, one of which is connected to receive said product from said integration multiplier;
   a clipper having an input and an output and having positive and negative saturation values, the output of said clipper being coupled to the other input of said integration adder and corresponding to the output of said integrator; and
   a delay connected between said integration adder output and an input of said clipper.

8. The encoder of claim 7 further comprising means for reducing said clipper output by an integration decay factor.

9. An encoder comprising:
   a thresholder having an analog input and a digital output representing the relationship between a signal amplitude at said analog input and a predetermined threshold;

an integrator having an output and one input connected to the output of the thresholder and a second input that receives a step size value, the output of the integrator corresponding to a product of said thresholder output and said step size value;

an adder having one input that receives an analog input signal that is to be encoded and a second input connected to the output of said integrator, the output of said adder being coupled to said analog input of said thresholder;

a step size controller responsive to an analog signal level related to said analog input signal for varying said step size value in response to variations in said analog signal level;

a source producing noise;

a noise amplitude controller responsive to an analog signal level related to said analog input signal for varying the amplitude of said noise in response to variations in said analog signal level to produce noise having a controlled amplitude sufficient to reduce the correlation with said analog input signal of an error between the output of said integrator and said analog input signal; and an adder for adding the noise having a controlled amplitude to said analog input signal.

10. The encoder of claim 9 wherein said noise amplitude controller comprises means for regulating said noise amplitude so as to prevent said noise amplitude from exceeding the amplitude of said analog input signal.

11. The encoder of claim 10 wherein said noise amplitude controller comprises means for regulating said noise amplitude so as to maintain said noise amplitude less than the amplitude of said analog input signal by a desired amount.

12. The encoder of claim 9 wherein said noise amplitude controller comprises means for reducing said noise amplitude by a predetermined amount whenever said analog signal level is reduced by a threshold amount for a prescribed number of sample periods.

13. A decoder for decoding an encoded signal, comprising:

an integrator having an output and one input connected to receive the encoded signal and a second input that receives a step size value, the output of the integrator corresponding to a product of said encoded signal and said step size value; and a step size controller responsive to an analog signal level of said integrator output for determining and varying said step size value in response to variations in said analog signal level, a step size controller responsive to an analog signal level related to said analog input signal for determining and varying said step size value in response to variations in said analog signal level, said step size controller having an amplitude detector to determine and output whether an amplitude of the analog signal level is above a predetermined detector threshold, means for storing a previous step size value, means for restoring said step size value to said previous step size value based on the output of said amplitude detector, means for storing a largest value of said step size that was determined by said step size controller, and means for restoring the step size to the largest determined step size when the amplitude of the analog signal level exceeds the detector threshold of the amplitude detector.

14. The decoder of claim 13 wherein said step size controller comprises means for reducing said step size by a predetermined amount whenever said analog signal level is reduced by a threshold amount for a prescribed number of sample periods.

15. The decoder of claim 13 wherein said step size controller comprises means for regulating said step size so as to prevent said step size from exceeding the amplitude of said analog input signal.

16. The decoder of claim 15 wherein said step size controller comprises means for regulating said step size so as to maintain said step size less than the amplitude of said analog input signal by a desired amount.

17. The decoder of claim 13 wherein the output of said integrator corresponds to a reconstructed version of said analog input signal, and wherein said analog signal level related to said analog input signal is the amplitude of the output of said integrator.

18. The decoder of claim 13 wherein said integrator comprises:

an integration multiplier that produces a product of said thresholder output and said step size value;

an integration adder having an output and a pair of inputs, one of which is connected to receive said product from said integration multiplier;

a clipper having an input and an output and having positive and negative saturation values, the output of said clipper being coupled to the other input of said integration adder and corresponding to the output of said integrator; and a delay connected between said integration adder output and an input of said clipper.

19. The decoder of claim 18 further comprising means for reducing said clipper output by an integration decay factor.

20. A method of encoding an analog input signal, comprising:

thresholding the analog level at an input node to produce a digital output representing the relationship between a signal amplitude at said input node and a predetermined threshold;

integrating the output of the thresholder in accordance with a step size value to produce an integration output;

adding the analog input signal with a currently available version of the integration output and applying the result to said input node; and controlling, by a step size controller, said step size value in response to variations in an analog signal level related to said analog input signal, said step size controller also determining said step size value, said step size controller also determining and outputting whether an amplitude of the analog signal level is above a predetermined detector threshold, storing a previous step size value, restoring said step size value to said previous step size value based on the output of said amplitude detector, storing a largest value of said step size that was determined by said step size controller, and restoring the step size to the largest determined step size when the amplitude of the analog signal level exceeds the detector threshold of the amplitude detector.

21. The method of claim 20 wherein the step of controlling said step size comprises reducing said step size by a predetermined amount whenever said analog signal level is reduced by a threshold amount for a prescribed number of sample periods.

22. The method of claim 20 wherein the step of controlling said step size comprises regulating said step size so as to prevent said step size from exceeding the amplitude of said analog input signal.

23. The method of claim 22 wherein the step of controlling said step size comprises regulating said step size so as to maintain said step size less than the amplitude of said analog input signal by a desired amount.

24. The method of claim 20 wherein said integration output corresponds to a reconstructed version of said analog input signal, and wherein said analog signal level related to said analog input signal is the amplitude of said integration output.

25. The method of claim 20 wherein said analog signal level is the amplitude of said analog input signal.

26. The method of claim 20 wherein the step of integrating comprises:

producing a product of said digital output and said step size value;

adding said integration output and said product to produce a sum;

clipping said sum in accordance with positive and negative saturation values, to produce a clipped output corresponding to said integration output.

27. The method of claim 26 further comprising reducing said clipped output by an integration decay factor.

28. A method of encoding an analog input signal, comprising:

thresholding the analog level at an input node to produce a digital output representing the relationship between a signal amplitude at said input node and a predetermined threshold;

integrating the output of the thresholder in accordance with a step size value to produce an integration output;

adding the analog input signal with a currently available version of the integration output and applying the result to said input node;

controlling said step size value in response to variations in an analog signal level related to said analog input signal;

providing noise;

varying the amplitude of said noise in response to variations in said analog signal level to produce noise having a controlled amplitude sufficient to reduce the correlation with said analog input signal of an error between the output of said integrator and said analog input signal; and adding the noise having a controlled amplitude to said input node.

29. The method of claim 28 wherein the step of varying said noise amplitude comprises regulating said noise amplitude so as to prevent said noise amplitude from exceeding the amplitude of said analog input signal.

30. The method of claim 29 wherein the step of varying said noise amplitude comprises regulating said noise amplitude so as to maintain said noise amplitude less than the amplitude of said analog input signal by a desired amount.

31. The method of claim 28 wherein the step of varying said noise amplitude comprises reducing said noise amplitude by a predetermined amount whenever said analog signal level is reduced by a threshold amount for a prescribed number of sample periods.

32. A method for decoding an encoded signal, comprising:

integrating the encoded signal in accordance with a step size value, the output of the integrator corresponding to a product of the encoded signal and said step size value; and varying, by a step size controller, said step size value in response to variations in an analog signal level of said integrator output, said step size controller also determining said step size value, said step size controller also determining and outputting whether an amplitude of the analog signal level is above a predetermined detector threshold, storing a previous step size value, restoring said step size value to said previous step size value based on the output of said amplitude detector, storing a largest value of said step size that was determined by said step size controller, and restoring the step size to the largest determined step size when the amplitude of the analog signal level exceeds the detector threshold of the amplitude detector.

33. The method of claim 32 wherein the step of varying said step size comprises reducing said step size by a predetermined amount whenever said analog signal level is reduced by a threshold amount for a prescribed number of sample periods.

34. The method claim 32 wherein the step of varying said step size comprises regulating said step size so as to prevent said step size from exceeding the amplitude of said analog input signal.

35. The method of claim 34 wherein the step of varying said step size comprises regulating said step size so as to maintain said step size less than the amplitude of said analog input signal by a desired amount.

36. The method of claim 32 wherein the step of integrating comprises:

producing a product of said encoded signal and said step size value;

adding said product and said integration output to produce a sum;

clipping said sum in accordance with positive and negative saturation values, the output of said clipper corresponding to the output of said integrator.

37. The method of claim 36 further comprising reducing said clipper output by an integration decay factor.

* * * * *